_(12)_ United States Patent
Wei et al.

(10) Patent No.: US 8,583,983 B2
(45) Date of Patent: Nov. 12, 2013

(54) TURBO INTERLEAVER FOR HIGH DATA RATES

(75) Inventors: Yongbin Wei, San Diego, CA (US); Jing Sun, San Diego, CA (US); Durga Prasad Malladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 897 days.

(21) Appl. No.: 12/443,975

(22) PCT Filed: Nov. 1, 2007

(86) PCT No.: PCT/US2007/083284
§ 371 (c)(1),
(2), (4) Date: Jul. 2, 2009

(87) PCT Pub. No.: WO2008/057906
PCT Pub. Date: May 15, 2008

(65) Prior Publication Data
US 2010/0077265 A1    Mar. 25, 2010

Related U.S. Application Data

(60) Provisional application No. 60/863,962, filed on Nov. 1, 2006.

(51) Int. Cl.
*H03M 13/00* (2006.01)
(52) U.S. Cl.
USPC ............................ 714/755; 714/702; 714/786
(58) Field of Classification Search
USPC .......................................... 714/702, 755, 786
See application file for complete search history.

(56) References Cited

U.S. PATENT DOCUMENTS 6,453,442 B1    9/2002  Sadjadpour et al.
6,813,742 B2 *  11/2004 Nguyen ........................ 714/794
6,928,604 B2 *  8/2005  Park et al. ..................... 714/788
(Continued)

FOREIGN PATENT DOCUMENTS

EP    1667329 A1    6/2006
JP    2003528477 A  9/2003
(Continued)

OTHER PUBLICATIONS

International Search Report and Written Opinion, PCT/US2007/083284, European Patent Office, Oct. 30, 2008.
(Continued)

*Primary Examiner* — Esaw Abraham

(57) ABSTRACT

Techniques for supporting high decoding throughput are described. A transmitter may encode a code block of data bits with a Turbo encoder. A receiver may perform decoding for the code block with a Turbo decoder having multiple soft-input soft-output (SISO) decoders. A contention-free Turbo interleaver may be used if the code block size is larger than a threshold size. A regular Turbo interleaver may be used if the code block size is equal to or smaller than the threshold size. The contention-free Turbo interleaver reorders the data bits in the code block such that information from the multiple SISO decoders, after interleaving or deinterleaving, can be written in parallel to multiple storage units in each write cycle without encountering memory access contention. The regular Turbo interleaver can reorder the data bits in the code block in any manner without regard to contention-free memory access.

31 Claims, 9 Drawing Sheets

(56) References Cited

U.S. PATENT DOCUMENTS

| | | | |
|---|---|---|---|
| 7,437,650 B2* | 10/2008 | Bickerstaff et al. | 714/755 |
| 7,633,377 B2* | 12/2009 | Sadr | 340/10.1 |
| 7,657,797 B2* | 2/2010 | Eroz et al. | 714/701 |
| 7,761,750 B2* | 7/2010 | Eroz et al. | 714/701 |
| 7,925,956 B2* | 4/2011 | Nimbalker et al. | 714/755 |
| 2002/0124221 A1 | 9/2002 | Goldman | |
| 2003/0014700 A1 | 1/2003 | Giulietti et al. | |

FOREIGN PATENT DOCUMENTS

| | | |
|---|---|---|
| JP | 2004531138 A | 10/2004 |
| JP | 2008092571 A | 4/2008 |
| RU | 2235424 C2 | 8/2004 |
| RU | 2274951 C2 | 4/2006 |
| WO | 0010257 A1 | 2/2000 |
| WO | 0035103 | 6/2000 |
| WO | 2004040774 | 5/2004 |
| WO | 2006082923 A1 | 8/2006 |

OTHER PUBLICATIONS

Nimbalker, A et al: "Contention-free interleavers" Information Theory, 2004. ISIT 2004. Proceedings. International Symposium on Chicago, Illinois, USA Jun. 27-Jul. 2, 2004, Piscataway, NJ, USA, IEEE, Jun. 27, 2004, p. 52, XP010749763.

Berrou, et al., "Designing good permutations for turbo codes: towards a single model," 2004 IEEE International Conference on Communications, vol. 1, Jun. 20-24, 2004, pp. 341-345.

Crozier, et al., "High-Performance Low-Memory Interleaver Banks for Turb-Codes," Proc. 54th IEEE Vehicular Tech., vol. 4, Oct. 2001, pp. 2394-2398.

Sun, et al., "Interleavers for Turbo Codes Using Permutation Polynomials Over Integer Rings," IEEE Transactions on Information Theory, vol. 51, Issue 1, Jan. 2005, pp. 101-119.

3GPP TS 25.212 v6.10.0, "Multiplexing and channel coding (FDD)," Release 6, Dec. 2006.

Berrou, A., et al., "Near Shannon limit error-correcting coding and decoding: Turbo codes", Proceedings 1993 IEEE International Conference on communications, Geneva, Switzerland, pp. 1064-1070 (May 1993).

Dobkin, et al., "Parallel interleaver design and VLSI architecture for low-latency MAP turbo decoders", IEEE Trans. VLSI Systems, vol. 13, Issue 4, Apr. 2005, pp. 427-438.

Giulietti, et al., "Parallel turbo coding interleavers: avoiding collisions in accesses to storage elements", Electronics Letters, vol. 38, Issue 5, pp. 232-234.

Schurgers, et al., "Memory Optimization of MAP Turbo Decoder Algorithms", IEEE Trans. VLSI Systems, vol. 9, No. 2, 2001, pp. 305-312.

Taiwan Search Report—TW096141264—TIPO—Aug. 18, 2011.

Takeshita O.Y., et al., "On maximum contention-free interleavers and permutation polynomials over integer rings", Information Theory, IEEE Transactions on, Mar. 2006, vol. 52, Issue:3 , pp. 1249-1253.

Tarable, et al., "Mapping interleaving laws to parallel turbo and LDPC decoder architectures", IEEE Tran. Information Theory, vol. 50, Issue 9, Sep. 2004, pp. 2002-2009.

Thul, et al., "Concurrent interleaving architectures for high-throughput channel coding", ICASSP 2003, vol. 2, pp. 613-616.

Thul, et al., "Enabling High-Speed Turbo-Decoding Through Concurrent Interleaving", IEEE International Symposium on Circuits and Systems, vol. 1, pp. 897-900, 2002.

Thul, et al., "Optimized concurrent interleaving architecture for high-throughput turbo-decoding", The 9th International Conference on Electronics, Circuits and Systems, vol. 3, pp. 1099-1102, 2002.

Qualcomm Europe: "Design of Turbo Code Internal Interleaver", 3GPP TSG-RAN WG1 #47, R1-063443, Nov. 6-10, 2006, pp. 1-5.

* cited by examiner

TURBO INTERLEAVER FOR HIGH DATA RATES

The present application claims priority to provisional U.S. Application Ser. No. 60/863,962, entitled "A METHOD AND APPARATUS FOR CONTENTION FREE TURBO INTERLEAVER," filed Nov. 1, 2006, assigned to the assignee hereof and incorporated herein by reference.

BACKGROUND

I. Field

The present disclosure relates generally to communication, and more specifically to encoding and decoding techniques.

II. Background

Wireless communication systems are widely deployed to provide various communication content such as voice, video, packet data, messaging, broadcast, etc. These wireless systems may be multiple-access systems capable of supporting multiple users by sharing the available system resources. Examples of such multiple-access systems include Code Division Multiple Access (CDMA) systems, Time Division Multiple Access (TDMA) systems, Frequency Division Multiple Access (FDMA) systems, Orthogonal FDMA (OFDMA) systems, and Single-Carrier FDMA (SC-FDMA) systems.

Newer wireless communication systems may support wide bandwidth and/or multiple-input multiple-output (MIMO) operation in order to achieve high data throughput. A user equipment (UE) with wide bandwidth and/or MIMO capability may need to support a very high peak data rate. For example, the peak data rate for the UE in a 20 MHz system with 4×4 MIMO configuration may be as high as 200+ megabits/second (Mbps). The UE's decoding capacity, which is usually the bottleneck of the receiver processing at the UE, should be designed accordingly in order to support such a high peak data rate.

SUMMARY

Techniques for efficiently supporting high decoding throughput are described herein. A transmitter (e.g., a base station) may encode a code block of data bits with a Turbo encoder having multiple constituent encoders and a code interleaver. A receiver (e.g., a UE) may perform decoding for the code block with a Turbo decoder having at least one soft-input soft-output (SISO) decoder, at least one code interleaver, and at least one code deinterleaver. The receiver may use multiple SISO decoders operating in parallel on different segments of the code block to achieve high decoding throughput. The multiple SISO decoders may operate in conjunction with multiple code interleavers, multiple code deinterleavers, and multiple storage units.

The data bits in the code block may be interleaved (i.e., reordered or shuffled) based on a Turbo interleaver. A Turbo interleaver is a mapping or a function that specifies how the data bits in the code block should be reordered. The code interleaver in the Turbo encoder operates based on the Turbo interleaver. Similarly, the single or multiple code interleavers in the Turbo decoder operate based on the Turbo interleaver, and the single or multiple code deinterleavers in the Turbo decoder operate based on an inverse of the Turbo interleaver.

In an aspect, a "contention-free" Turbo interleaver may be used if the code block size is larger than a threshold size, and a "regular" Turbo interleaver may be used if the code block size is equal to or smaller than the threshold size. A contention-free Turbo interleaver is a mapping or a function that reorders the data bits in the code block such that information from multiple SISO decoders, after interleaving or deinterleaving, can be written in parallel to multiple storage units in each write cycle without encountering memory access contention of these storage units. A regular Turbo interleaver is a mapping or a function that can reorder the data bits in the code block in any manner without regard to contention-free memory access at the Turbo decoder. Large code block sizes may be used for large data payloads requiring high decoding throughput whereas small code block sizes may be used for small data payloads. Multiple SISO decoders may be used for large code block sizes (e.g., those larger than the threshold size) and may benefit from the use of the contention-free Turbo interleaver.

The transmitter may perform Turbo encoding for the code block based on multiple constituent encoders and the contention-free Turbo interleaver if the code block size is larger than the threshold size. The transmitter may perform Turbo encoding for the code block based on the multiple constituent encoders and the regular Turbo interleaver if the code block size is equal to or smaller than the threshold size.

The receiver may perform Turbo decoding for the code block based on multiple SISO decoders and the contention-free Turbo interleaver if the code block size is larger than the threshold size. The receiver may perform Turbo decoding for the code block based on at least one SISO decoder and the regular Turbo interleaver if the code block size is equal to or smaller than the threshold size.

Various aspects and features of the disclosure are described in further detail below.

DETAILED DESCRIPTION

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16

(WiMAX), IEEE 802.20, Flash-OFDM®, etc. UTRA, E-UTRA and GSM are part of Universal Mobile Telecommunication System (UMTS). 3GPP Long Term Evolution (LTE) is an upcoming release of UMTS that uses E-UTRA, which employs OFDMA on the downlink and SC-FDMA on the uplink. UTRA, E-UTRA, GSM, UMTS and LTE are described in documents from an organization named "3rd Generation Partnership Project" (3GPP). cdma2000 and UMB are described in documents from an organization named "3rd Generation Partnership Project 2" (3GPP2). The techniques may also be used for wireless local area networks (WLANs), which may implement any radio technology in the IEEE 802.11 family of standards, Hiperlan, etc. These various radio technologies and standards are known in the art. For clarity, certain aspects of the techniques are described below for LTE, and LTE terminology is used in some of the description below.

The techniques may be used for a UE as well as a base station. A UE may also be referred to as a mobile station, a terminal, an access terminal, a subscriber unit, a station, etc. A UE may be a cellular phone, a personal digital assistant (PDA), a wireless communication device, a wireless modem, a handheld device, a laptop computer, a cordless phone, etc. A UE may communicate with one or more base stations via transmissions on the downlink and uplink. A base station may also be referred to as a Node B, an evolved Node B (eNB), an access point, etc.

The techniques may be used for single-input single-output, single-input multiple-output, multiple-input single-output, and/or multiple-input multiple-output (MIMO) transmission. Single-input refers to one transmit antenna and multiple-input refers to multiple transmit antennas for data transmission. Single-output refers to one receive antenna and multiple-output refers to multiple receive antennas for data reception.

Figure 1:
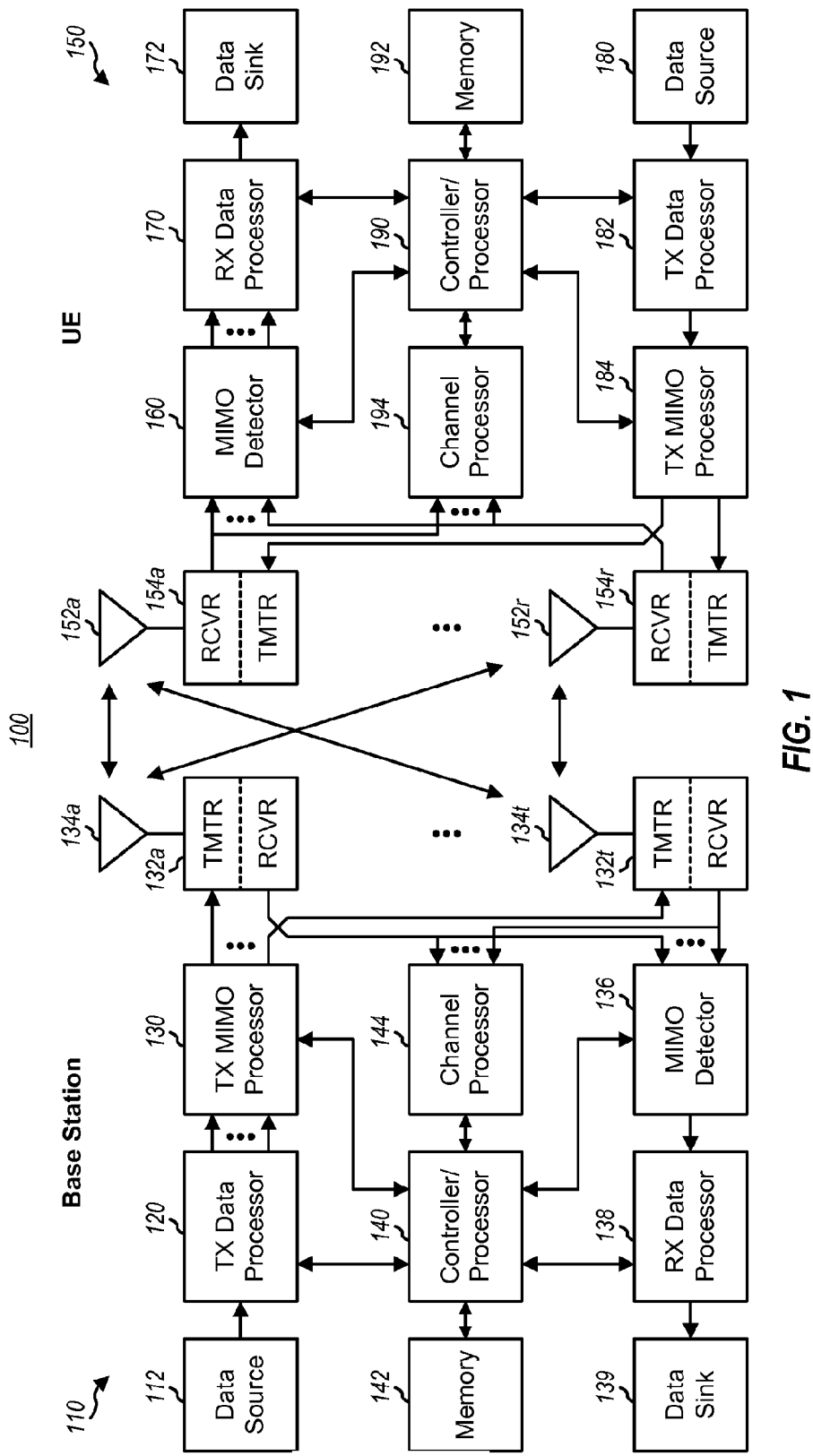
FIG. 1 shows a block diagram of a base station and a UE.

FIG. 1 shows a block diagram of a design of a base station 110 and a UE 150 in a wireless communication system 100. Base station 110 is equipped with multiple (T) antennas 134a through 134t that may be used for data transmission and reception. UE 150 is equipped with multiple (R) antennas 152a through 152r that may be used for data transmission and reception. Each antenna may be a physical antenna or an antenna array.

At base station 110, a transmit (TX) data processor 120 may receive traffic data from a data source 112, process (e.g., format, encode, interleave, and symbol map) the traffic data based on a transport format, and provide data symbols. As used herein, a data symbol is a symbol for data, a pilot symbol is a symbol for pilot, and a symbol is typically a complex value. The data symbols and pilot symbols may be modulation symbols from a modulation scheme such as PSK or QAM. Pilot is data that is known a priori by both a transmitter and a receiver. A transport format may indicate a code block size, a modulation and coding scheme, etc. A transport format may also be referred to as a rate, a packet format, etc.

A TX MIMO processor 130 may multiplex the data symbols with pilot symbols and may perform direct MIMO mapping, precoding/beamforming, etc. A symbol may be sent from one antenna for direct MIMO mapping or from multiple antennas for precoding/beamforming. Processor 130 may provide T output symbol streams to T transmitters (TMTR) 132a through 132t. Each transmitter 132 may process its output symbol stream (e.g., for OFDM, SC-FDM, CDMA, etc.) to obtain an output chip stream. Each transmitter 132 may further condition (e.g., convert to analog, filter, amplify, and upconvert) its output chip stream and generate a downlink signal. T downlink signals from transmitters 132a through 132t may be transmitted from T antennas 134a through 134t, respectively.

At UE 150, R antennas 152a through 152r may receive the downlink signals, and each antenna 152 may provide a received signal to a respective receiver (RCVR) 154. Each receiver 154 may process (e.g., filter, amplify, downconvert, and digitize) its received signal to obtain samples and may further process the samples (e.g., for OFDM, SC-FDM, CDMA, etc.) to obtain received symbols. Receivers 154a through 154r may provide received data symbols to a MIMO detector 160 and provide received pilot symbols to a channel processor 194. Channel processor 194 may estimate the downlink channel response based on the received pilot symbols and provide channel estimates to MIMO detector 160. MIMO detector 160 may perform MIMO detection on the received data symbols with the channel estimates and provide data symbol estimates. A receive (RX) data processor 170 may further process (e.g., symbol demap, deinterleave, and decode) the data symbol estimates and provide decoded data to a data sink 172. In general, the processing by MIMO detector 160 and RX data processor 170 is complementary to the processing by TX MIMO processor 130 and TX data processor 120 at base station 110.

UE 150 may evaluate the channel conditions and send feedback information to base station 110. The feedback information may comprise a MIMO rank indicating the number of data streams or layers to send in parallel, channel quality indicators (CQIs), and/or other information. The feedback information and traffic data from a data source 180 may be processed by a TX data processor 182, multiplexed with pilot symbols and processed by a TX MIMO processor 184, and further processed by transmitters 154a through 154r to generate R uplink signals, which may be transmitted via antennas 152a through 152r.

At base station 110, the uplink signals may be received by T antennas 134a through 134t, processed by receivers 132a through 132t, detected by a MIMO detector 136, and further processed by an RX data processor 138 to recover the feedback information and traffic data sent by UE 150. Controller/processor 140 may control the data transmission to UE 150 based on the feedback information. A channel processor 144 may estimate the uplink channel response based on the received pilot symbols and provides channel estimates, which may be used for MIMO processing or detection.

Controllers/processors 140 and 190 may direct the operation at base station 110 and UE 150, respectively. Memories 142 and 192 may store data and program codes for base station 110 and UE 150, respectively.

Figure 2:
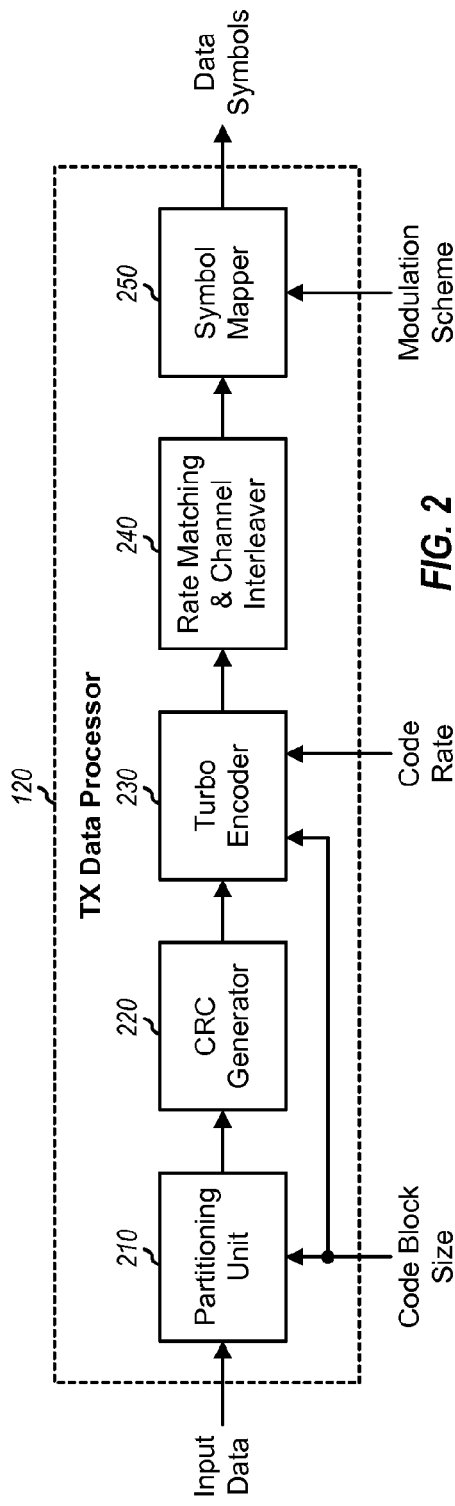
FIG. 2 shows a block diagram of a transmit (TX) data processor.

FIG. 2 shows a block diagram of a design of TX data processor 120, which may also be used for TX data processor 182 in FIG. 1. Within TX data processor 120, a partitioning unit 210 may receive data to transmit and partition the data into code blocks of a selected code block size. A code block may also be referred to as a data block, a transport block, a packet, etc. Each code block may be encoded and decoded separately. A cyclic redundancy check (CRC) generator 220 may generate a CRC value for each code block and append the CRC value to the code block. The CRC value may be used by the receiver to determine whether the code block is decoded correctly or in error. A Turbo encoder 230 may encode each code block based on a selected code rate and provide an encoded block. A rate matching & channel interleaver 240 may select a subset of the code bits from Turbo encoder 230 for the encoded block, interleave the selected code bits, and provide an interleaved block. The rate matching & interleaving may provide time, frequency, and/or spatial diversity for the code bits. A symbol mapper 250 may map the interleaved bits to data symbols based on a selected modulation scheme. The selected code block size, code rate, and modulation scheme may be determined based on a transport format, which may be selected based on channel conditions, UE capability, availability of system resources, etc.

Figure 3:
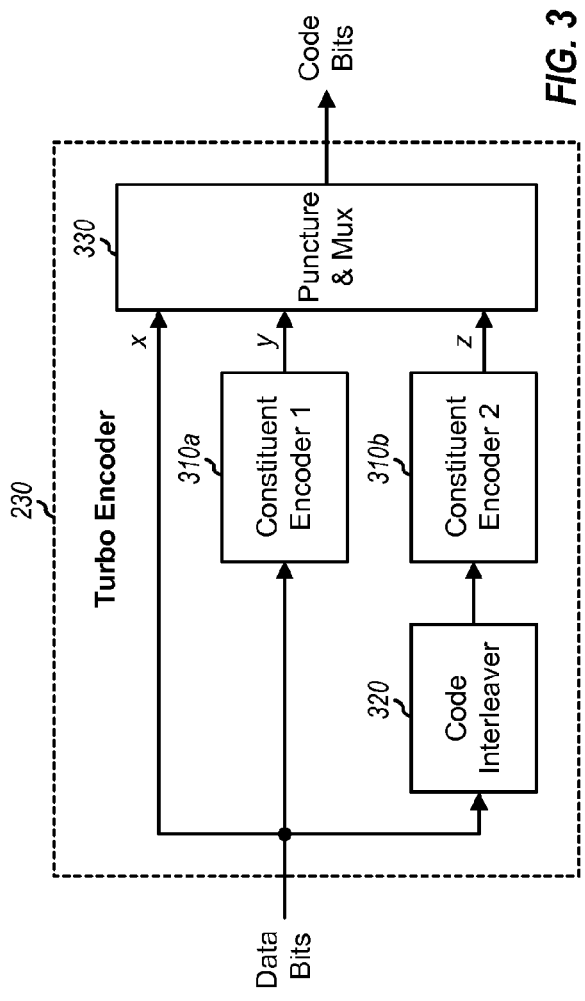
FIG. 3 shows a block diagram of a Turbo encoder.

FIG. 3 shows a block diagram of a design of Turbo encoder 230 in FIG. 2. Turbo encoder 230 implements a parallel concatenated convolutional code (PCCC) and includes two constituent encoders 310a and 310b, a code interleaver 320, and a puncture and multiplex (Mux) unit 330. Turbo encoder 230 encodes a code block of N data bits and provides a corresponding encoded block of S code bits, where N and S may be any suitable values.

Within Turbo encoder 230, code interleaver 320 may interleave or reorder the data bits (denoted as x) in the code block based on a selected Turbo interleaver, which may be a contention-free Turbo interleaver or a regular Turbo interleaver as described below. Constituent encoder 310a may encode the data bits based on a first constituent code and provide first parity bits (denoted as y). Similarly, constituent encoder 310b may encode the interleaved data bits from code interleaver 320 based on a second constituent code and provide second parity bits (denoted as z). Constituent encoders 310a and 310b may implement two recursive systematic constituent codes, which may be convolutional codes. Unit 330 may receive the data bits and the parity bits from constituent encoders 310a and 310b and may puncture or delete a sufficient number of bits based on the selected code rate to obtain the desired number of bits. Unit 330 may multiplex the undeleted data bits and parity bits and provide the coded bits for the encoded block. The coded bits may include the data bits (which are also referred to as systematic bits), followed by the first parity bits, and then followed by the second parity bits.

Figure 4:
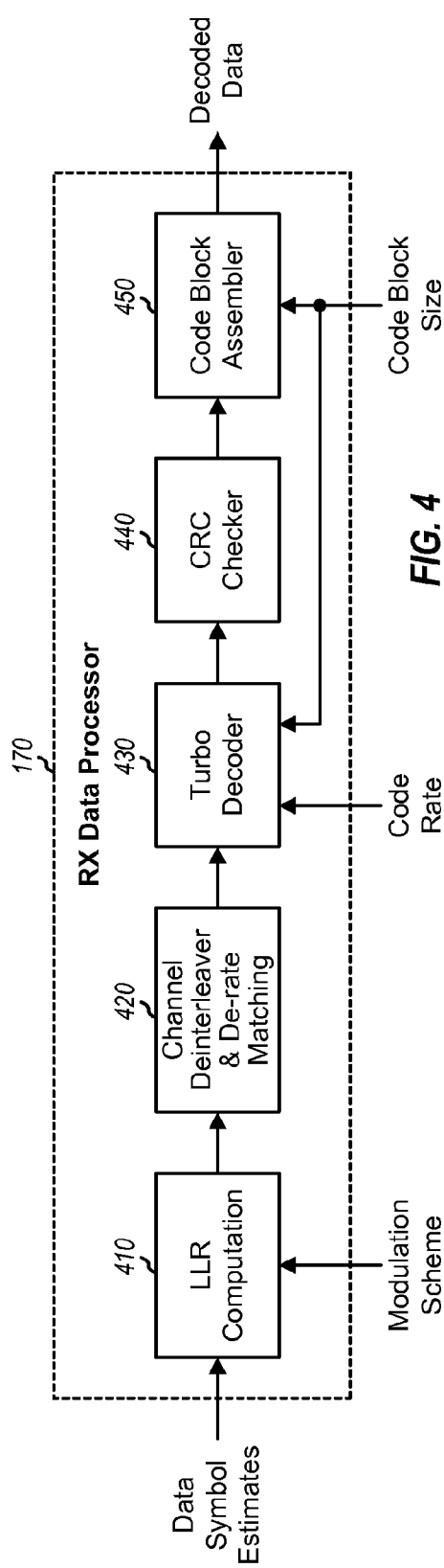
FIG. 4 shows a block diagram of a receive (RX) data processor.

FIG. 4 shows a block diagram of a design of RX data processor 170, which may also be used for RX data processor 138 in FIG. 1. Within RX data processor 170, a log-likelihood ratio (LLR) computation unit 410 may receive the data symbol estimates from MIMO detector 160 and compute the LLRs of the code bits for each data symbol estimate. A data symbol may be obtained by mapping B code bits to a complex value in a signal constellation. B LLRs may be computed for the B code bits of the data symbol based on a corresponding data symbol estimate. The LLR for each code bit may indicate the likelihood of the code bit being zero ('0') or one ('1') given the data symbol estimate for that code bit. A channel deinterleaver & de-rate matching unit 420 may perform deinterleaving and de-rate matching on the LLRs from unit 410 in a manner complementary to the interleaving and rate matching by unit 240 in FIG. 2 and provide input LLRs. A Turbo decoder 430 may decode each block of input LLRs from channel deinterleaver 420 and provide a decoded block. A CRC checker 440 may check each decoded block and provide a decoding status for the block. An assembler 450 may assemble the decoded blocks and provide decoded data.

Figure 5:
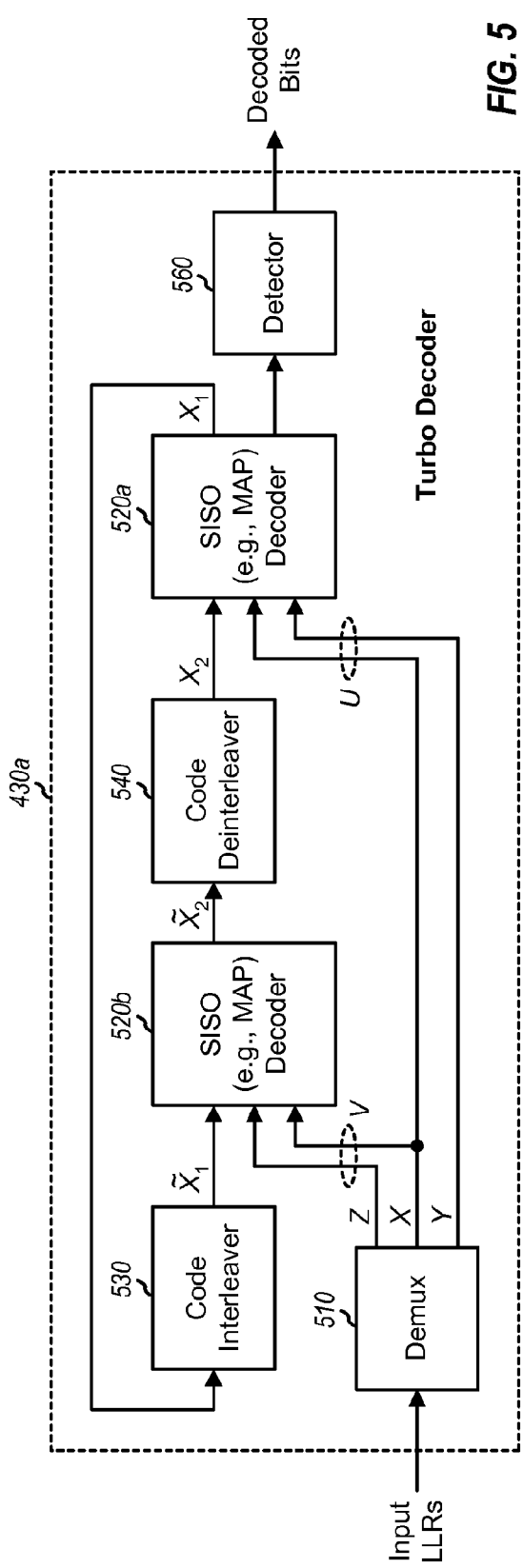
FIG. 5 shows a block diagram of a Turbo decoder.

FIG. 5 shows a block diagram of a design of a Turbo decoder 430a, which may be used for Turbo decoder 430 in FIG. 4. Within Turbo decoder 430a, a demultiplexer (Demux) 510 may receive input LLRs for a code block and demultiplex the input LLRs into LLRs X for data bits x, LLRs Y for first parity bits y, and LLRs Z for second parity bits z. A SISO decoder 520a may receive the data bit LLRs X and the first parity bit LLRs Y from demultiplexer 510 and deinterleaved data bit LLRs $X_2$ from a code deinterleaver 540. SISO decoder 520a may derive new LLRs $X_1$ for the data bits based on the first constituent code. A code interleaver 530 may interleave the data bit LLRs $X_1$ based on the selected Turbo interleaver (which is used for code interleaver 320 in FIG. 3) and provide interleaved data bit LLRs $\tilde{X}_1$. A SISO decoder 520b may receive the data bit LLRs X and the second parity bit LLRs Z from demultiplexer 510 and the interleaved data bit LLRs $\tilde{X}_1$ from code interleaver 530. SISO decoder 520b may derive new LLRs $\tilde{X}_2$ for the data bits based on the second constituent code. Code deinterleaver 540 may deinterleave the data bit LLRs $\tilde{X}_2$ based on an inverse of the selected Turbo interleaver and provide the deinterleaved data bit LLRs $X_2$.

SISO decoders 520a and 520b may be maximum a posteriori (MAP) decoders that may implement a BCJR MAP algorithm or a lower complexity derivative. SISO decoders 520a and 520b may also implement a soft-output Viterbi (SOV) algorithm or some other decoding algorithm known in the art.

The decoding by SISO decoders 520a and 520b may be iterated multiple times, e.g., 6, 8, 10, or more times. The decoding results may be more reliable after each iteration. After all decoding iterations are completed, a detector 560 may receive the final data bit LLRs from SISO decoder 520a, make a hard decision on each LLR, and provide decoded bits.

SISO decoders 520a and 520b may be operated in series, with extrinsic information from one SISO decoder being provided as an input to the other SISO decoder. Because of the serial operation of the two SISO decoders, one physical SISO decoder may be used to implement both SISO decoders 520a and 520b.

Figure 6:
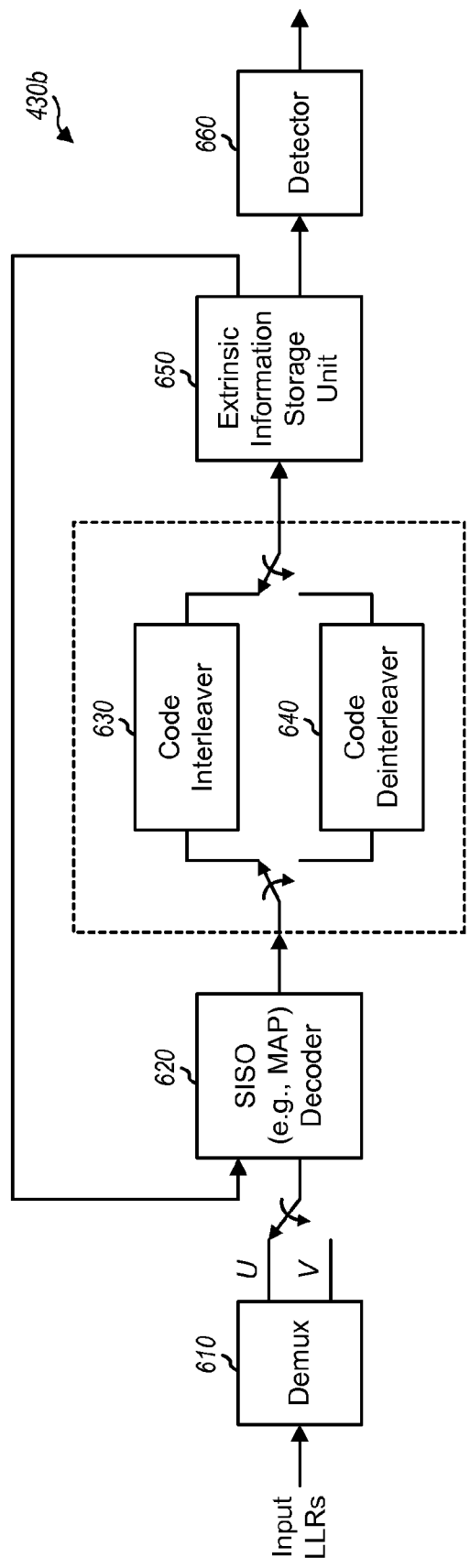
FIG. 6 shows a block diagram of a Turbo decoder with one SISO decoder.

FIG. 6 shows a block diagram of a Turbo decoder 430b, which is one design of Turbo decoder 430a in FIG. 5. Within Turbo decoder 430b, a demultiplexer 610 may receive input LLRs for a code block and demultiplex the input LLRs into LLRs U for the first constituent code and LLRs V for the second constituent code. LLRs U may include data bit LLRs X and first parity bit LLRs Y. LLRs V may include data bit LLRs X and second parity bit LLRs Z.

For the first constituent code, a SISO decoder 620 may receive LLRs U from demultiplexer 610 and LLRs $X_2$ from a storage unit 650 and derive new LLRs $X_1$. A code interleaver 630 may interleave LLRs $X_1$ based on the selected Turbo interleaver and provide interleaved LLRs $\tilde{X}_1$ to storage unit 650. For the second constituent code, SISO decoder 620 may receive LLRs V from demultiplexer 610 and LLRs $\tilde{X}_1$ from storage unit 650 and derive new LLRs $\tilde{X}_2$. A code deinterleaver 640 may deinterleave LLRs $\tilde{X}_2$ based on the inverse of the selected Turbo interleaver and provide deinterleaved LLRs $X_2$ to storage unit 650. Storage unit 650 may implement (i) code interleaver 630 by storing LLRs $X_1$ from SISO decoder 620 in interleaved order and (ii) code deinterleaver 640 by storing LLRs $\tilde{X}_2$ from SISO decoder 620 in deinterleaved order. The code interleaving and deinterleaving may be achieved by generating appropriate addresses for storage unit 650. A detector 660 may receive the final data bit LLRs after all decoding iterations are completed and may provide decoded bits.

UE 150 may have wide bandwidth and/or MIMO capability and may need to support a very high peak data rate, e.g., 200+ Mbps. The decoding capability of UE 150 may be a bottleneck. A high capacity Turbo decoder with parallel SISO decoders may be used to support a high peak data rate.

A Turbo encoder may encode a code block of N data bits and generate an encoded block of S code bits, where S is dependent on the code rate R, or R=N/S. A Turbo decoder with parallel SISO decoders may partition a whole trellis of N transitions for the N data bits of the code block into M segments. Each segment may cover one trellis window of K transitions, so that M=N/K. Each segment may be processed by a separate SISO decoder. M SISO decoders may perform decoding for the M segments in parallel.

Figure 7:
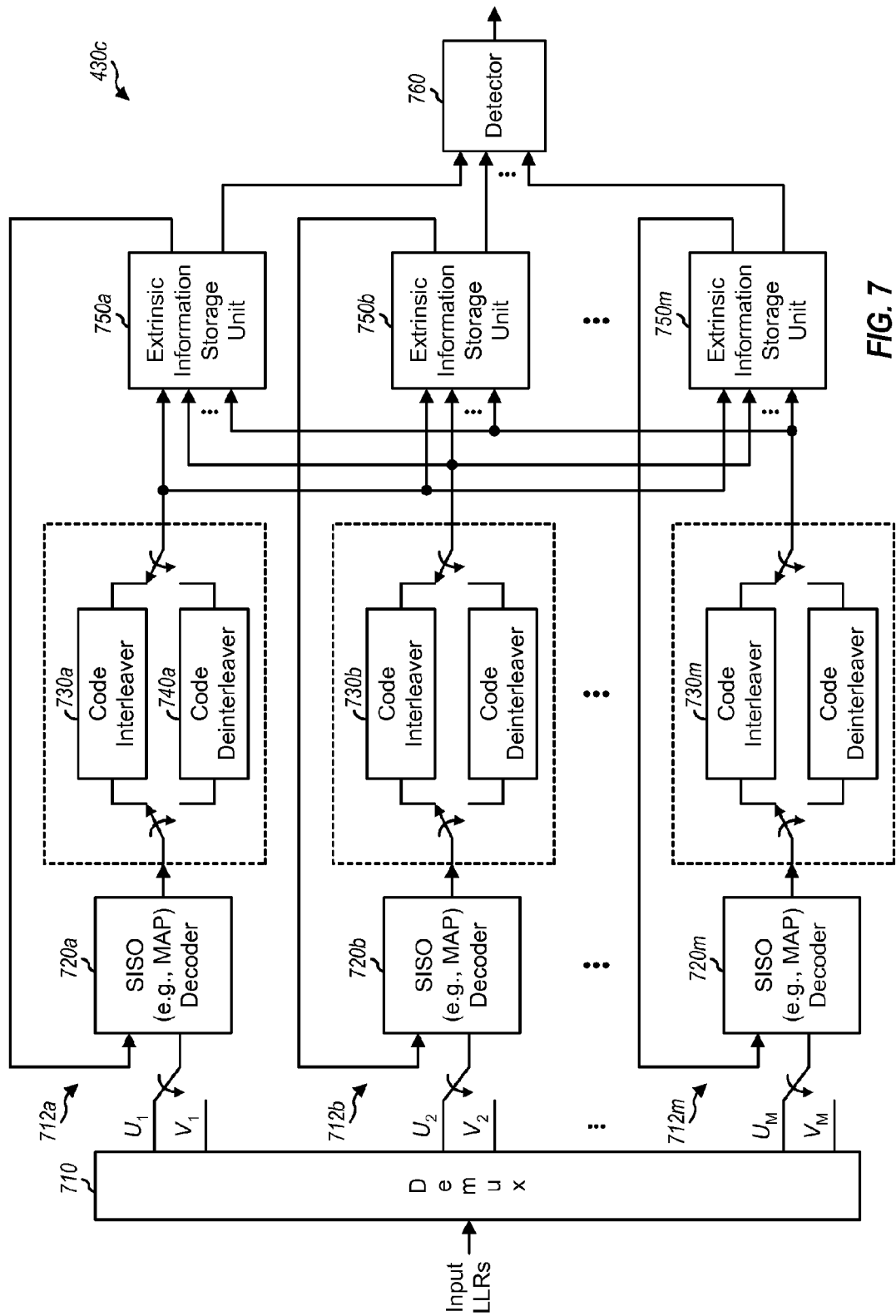
FIG. 7 shows a block diagram of a Turbo decoder with multiple SISO decoders.

FIG. 7 shows a block diagram of a design of a Turbo decoder 430c, which may be used for Turbo decoder 430 in FIG. 4. Turbo decoder 430c includes a demultiplexer 710 and M parallel segment decoders 712a through 712m. Each segment decoder 712 includes a SISO decoder 720, a code interleaver 730, a code deinterleaver 740, and a storage unit 750.

Within Turbo decoder 430c, demultiplexer 710 may receive and demultiplex the input LLRs for a code block into LLRs $U_m$ and $V_m$ for each segment m, where m∈{1, ..., M}. LLRs $U_m$ may include data bit LLRs $X_m$ and first parity bit LLRs $Y_m$ for the first constituent code for segment m. LLRs $V_m$ may include data bit LLRs $X_m$ and second parity bit LLRs $Z_m$ for the second constituent code for segment m. Demultiplexer 710 may provide each input LLR to one segment decoder 712.

Within segment decoder 712 for segment m, SISO decoder 720 may perform decoding for the first or second constituent code at any given moment. For the first constituent code, SISO decoder 720 may receive LLRs $U_m$ from demultiplexer 710 and LLRs $X_{m2}$ from a storage unit 750 and derive new LLRs $X_{m1}$. Code interleaver 730 may interleave LLRs $X_{m1}$ and provide interleaved LLRs $\tilde{X}_{m1}$ to storage unit 750. For the second constituent code, SISO decoder 620 may receive LLRs $V_m$ from demultiplexer 710 and LLRs $\tilde{X}_{m1}$ from storage unit 750 and derive new LLRs $\tilde{X}_{m2}$. Code deinterleaver 740 may deinterleave LLRs $\tilde{X}_{m2}$ and provide deinterleaved LLRs $X_{m2}$ to storage unit 750. Storage unit 750 may implement both code interleaver 730 and code deinterleaver 740.

For decoding of the first constituent code, the input LLRs (or input APPs) are in natural order. For segment m, the input LLRs correspond to data bits K m, K m+1, ..., K(m+1)−1 in the code block. For decoding of the second constituent code, the input LLRs are not in natural order. For segment m, the input LLRs correspond to data bits π(K m), π(K m+1), ..., π(K(m+1)−1) in the code block, where π(x) denotes a mapping function for the selected Turbo interleaver that maps a data bit at position x to position π(x).

Code interleavers 730a through 730m may operate based on the selected Turbo interleaver. Code deinterleavers 740a through 740m may operate based on the inverse of the selected Turbo interleaver. For the first constituent code, storage units 750a through 750m may provide input LLRs to SISO decoders 720a through 720m, respectively, and may store the outputs of code interleavers 730a through 730m, respectively. For the second constituent code, storage units 750a through 750m may provide input LLRs to SISO decoders 720a through 720m, respectively, and may store the outputs of code deinterleavers 740a through 740m, respectively. After all decoding iterations are completed, a detector 760 may receive the final data bit LLRs from storage units 750a through 750m and provide decoded bits.

As shown in FIGS. 5 through 7, an important feature of Turbo decoding is the exchange of "extrinsic" information between the decoding of the two constituent codes. The output LLRs from the decoding of the first constituent code are provided as input LLRs for the decoding of the second constituent code, and vice versa. The output LLRs from the decoding of one constituent code are in a different order from the input LLRs for the decoding of the other constituent code. Hence, the output LLRs are interleaved or deinterleaved, as appropriate, before being stored in the storage unit(s).

Each storage unit 750 may store LLRs for one SISO decoder 720 for one segment. Each storage unit 750 may store the LLRs in natural order for the first constituent code, then store the LLRs in interleaved order for the second constituent code, then store the LLRs in natural order for the first constituent code, etc.

Each SISO decoder 720 provides output LLRs that may be interleaved or deinterleaved and then provided to M storage units 750a through 750m. Each output LLR, after interleaving or deinterleaving, may be provided to any one of the M storage units 750.

The M SISO decoders 720a through 720m may continuously provide output LLRs that may be interleaved or deinterleaved and then provided to the M storage units 750a through 750m. If the output LLRs from multiple SISO decoders are mapped to the same storage unit in a given write cycle as a result of the interleaving or deinterleaving, then memory contention may occur and stall time may be inserted to resolve the memory contention. The stall time may reduce the capacity of the Turbo decoder.

A contention-free Turbo interleaver may be used to avoid memory contention during parallel decoding with multiple SISO decoders. A contention-free Turbo interleaver reorders the data bits in a code block such that information from multiple SISO decoders, after interleaving or deinterleaving, can be written in parallel to multiple storage units in each write cycle without encountering memory access contention. A contention-free Turbo interleaver may be defined mathematically as follows:

$$\left\lfloor \frac{\pi(Km+k)}{K} \right\rfloor \neq \left\lfloor \frac{\pi(Kn+k)}{K} \right\rfloor, \qquad \text{Eq (1)}$$

and $$\left\lfloor \frac{\pi^{-1}(Km+k)}{K} \right\rfloor \neq \left\lfloor \frac{\pi^{-1}(Kn+k)}{K} \right\rfloor, \qquad \text{Eq (2)}$$

for 0≤m,n<M, m≠n, and 0≤k<K, where ⌊x⌋ denotes a floor operator that provides a largest integer equal to or less than x, π(x) denotes a code interleaving function, and $\pi^{-1}$(x) denotes a code deinterleaving function.

Equation (1) indicates that the k-th data bits in any two segments m and n should be interleaved to different segments. This condition ensures that the M output LLRs from the M SISO decoders 720a through 720m for each write cycle, after interleaving, are mapped to M different storage units 750a through 750m, where the mapping is dependent on the code interleaving function π(x).

Equation (2) indicates that the k-th data bits in any two segments m and n should be deinterleaved to different segments. This condition ensures that the M output LLRs from the M SISO decoders 720a through 720m for each write cycle, after deinterleaving, are mapped to M different storage units 750a through 750m, where the mapping is dependent on the code deinterleaving function $\pi^{-1}$(x).

The conditions in equations (1) and (2) may be achieved based on various interleaver designs, as described below. A contention-free Turbo interleaver may be defined for specific values of N, M and K. The contention-free Turbo interleaver may then provide contention-free memory access for these specific values of N, M and K and may or may not provide contention-free memory access for other values of N, M and K.

The system may support a set of code block sizes, which may be selected based on various factors such as the expected range of data payload to transmit, coding efficiency, etc. A suitable code block size may be selected for use based on the amount of data to transmit.

Figure 8:
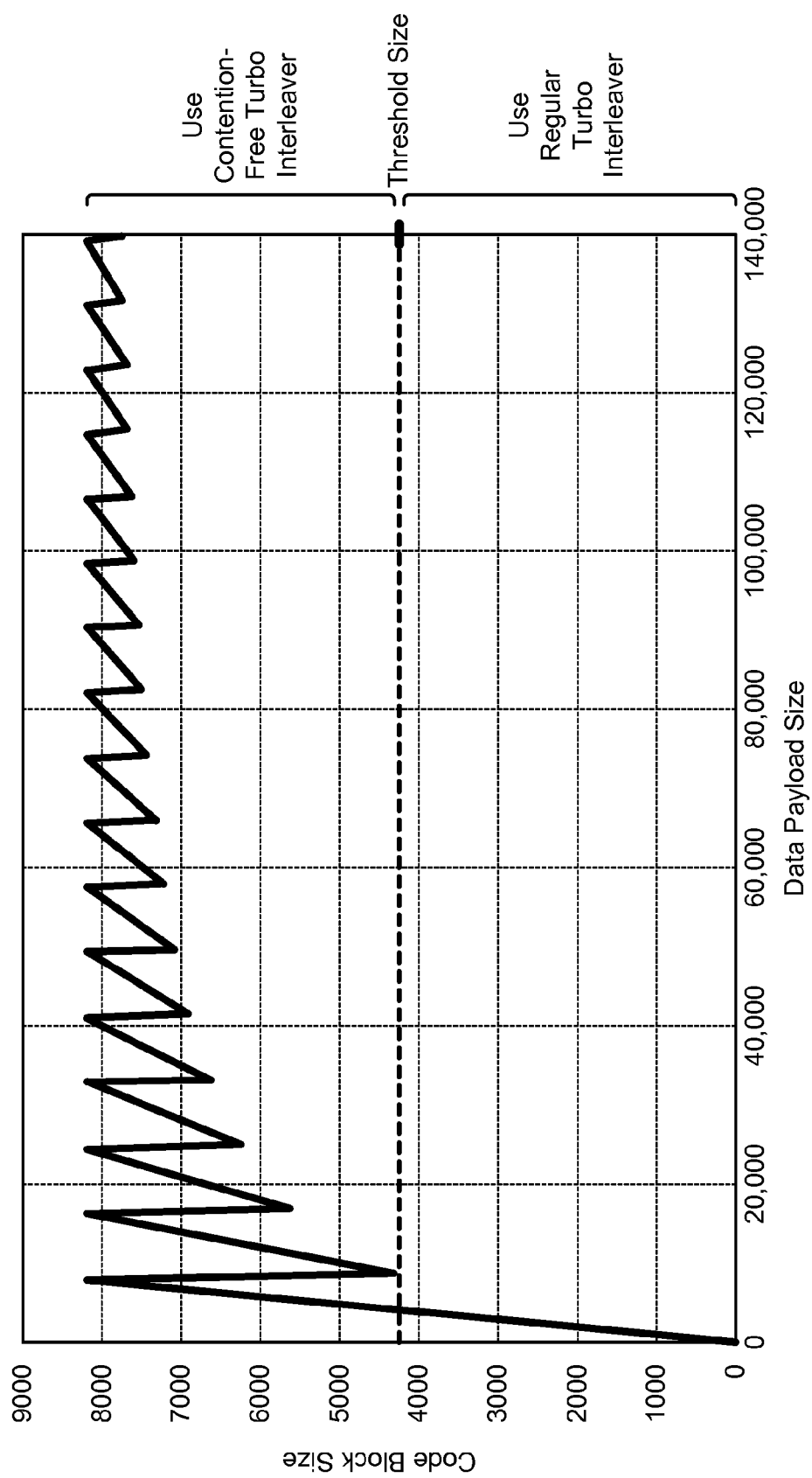
FIG. 8 shows a plot of code block size versus data payload.

FIG. 8 shows a plot of code block size versus data payload in accordance with one design. In this design, the largest code block size is 8192. For data payload equal to or less than 8192, one code block may be used for the entire data payload. For data payload ranging from 8193 to 16384, two code blocks may be used, and the data payload may be divided evenly between the two code blocks. In general, for data payload ranging from 8192 $N_B+1$ to 8192($N_B+1$), $N_B+1$ code blocks may be used, and the data payload may be divided evenly among the $N_{B+1}$ code blocks. As shown in FIG. 8, once the data payload is sufficiently large, the code block size is 4096 or larger.

A high capacity Turbo decoder with parallel SISO decoders (e.g., as shown in FIG. 7) may be used for large data payloads, which may be transmitted with wide bandwidth and/or MIMO. For small data payloads, a Turbo decoder with a single SISO decoder (e.g., as shown in FIG. 6) may be sufficient. Thus, contention-free Turbo interleaving may be necessary for only large data payloads, e.g., certain big payload size and beyond.

In an aspect, Turbo interleaving may be performed as follows:
Use a regular Turbo interleaver for small code block sizes that are equal to or smaller than a threshold size, and
Use contention-free Turbo interleavers for large code block sizes that are larger than the threshold size.

For the design shown in FIG. 8, the threshold size may be equal to 4096. In general, the threshold size may be selected based on the point at which a high capacity Turbo decoder is needed to meet decoding throughput requirements.

A regular Turbo interleaver may be used for small code block sizes up to the threshold size. In one design, the regular Turbo interleaver may be the Turbo interleaver defined in 3GPP Release 6 and described in 3GPP TS 25.212, entitled "Multiplexing and channel coding (FDD)," December 2006, which is publicly available. The 3GPP Release 6 Turbo interleaver can accommodate code block sizes up to 5114 and is well defined and verified. Other Turbo interleavers may also be used for the regular Turbo interleaver.

As shown in equations (1) and (2), the design of a contention-free Turbo interleaver is dependent on the code block size N, the number of segments M, and the segment size K. There may be a one-to-one mapping between N and a corresponding combination of M and K. For each large code block size N, a suitable Turbo interleaver function $\pi(x)$ may be defined for that code block size N (with the given M and K) to achieve good decoding performance. Decoding performance with the Turbo interleaver function $\pi(x)$ may be verified via computer simulation, lab measurements, field testing, etc., and possibly for each data payload using that code block size N. Different Turbo interleaver designs (e.g., with different parameter values) may be evaluated. Decoding performance may be verified for each Turbo interleaver design in order to find a Turbo interleaver design that can provide good (or the best possible) decoding performance. The Turbo interleaver design process may thus be complex and tedious, especially for a large number of code block sizes. By using contention-free Turbo interleavers for only large code block sizes instead of all code block sizes, the Turbo interleaver design complexity as well as implementation complexity may be greatly reduced.

In another aspect, a limited set of large code block sizes may be supported with contention-free Turbo interleavers instead of all possible sizes. In one design, the supported large code block sizes may be expressed as:

$$N_i = N_{th} + L \cdot i, \text{ for } i=1, 2, \ldots,\qquad \text{Eq (3)}$$

where $N_{th}$ is the threshold size,
L is a step size or increment between consecutive large code block sizes, and
$N_i$ is the i-th large code block size.

In the design shown in equation (3), the supported large code block sizes increase linearly by L. For each large code block size $N_i$, up to L−1 padding bits may be used, and the padding overhead may be up to $(L-1)/N_i$. L may be selected based on a tradeoff between Turbo interleaver complexity and padding overhead. A smaller value of L corresponds to more supported large code block sizes, which may in increase Turbo interleaver complexity but reduce padding overhead. The converse is true for a larger value of L.

In one design, the supported large code block sizes may be expressed as:

$$N_i = 4096 + 32 \cdot i, \text{ for } i=1, 2, \ldots, 128 \qquad \text{Eq (4)}$$

The design in equation (4) supports 128 different large code block sizes ranging from 4128 to 8192, in increment of L=32. 128 contention-free Turbo interleavers may be defined for the 128 different large code block sizes. The padding overhead for each large code block size is less than one percent.

In another design, the supported large code block sizes may be expressed as:

$$N_i = 4096 + 64 \cdot i, \text{ for } i=1, 2, \ldots, 64 \qquad \text{Eq (5)}$$

The design in equation (5) supports 64 different large code block sizes ranging from 4160 to 8192, in increment of L=64. 64 contention-free Turbo interleavers may be defined for the 64 different large code block sizes. The padding overhead for each large code block size is around 1.5 percent or lower.

Other values may also be used for $N_{th}$ and L, which determine the number of supported large code block sizes and the padding overhead.

In another design, the supported large code block sizes may be expressed as:

$$N_i = N_{i-1} + L_i, \text{ for } i=1, 2, 3, \ldots, \qquad \text{Eq (6)}$$

where $N_0 = N_{th}$ and $L_i$ is an increment for the i-th large code block size. In the design shown in equation (6), the supported large code block sizes can increase by different amounts $L_i$. For example, $L_i$ may be selected to achieve a target padding overhead for each large code block size while reducing Turbo interleaver complexity.

In general, any number of large code block sizes may be supported. A contention-free Turbo interleaver may be defined for each large code block size based on various designs.

In one design, a contention-free Turbo interleaver may be implemented with a dithered relative prime (DRP) interleaver. The DRP interleaver uses a relative prime (RP) interleaver that maps a data bit at location n to location (s+P·n) mod N, where P and N are relative primes, s is a starting index, and "mod N" denoted a modulo-N operation. The DRP interleaver further applies dithering prior to and after the RP interleaver.

Figure 9:
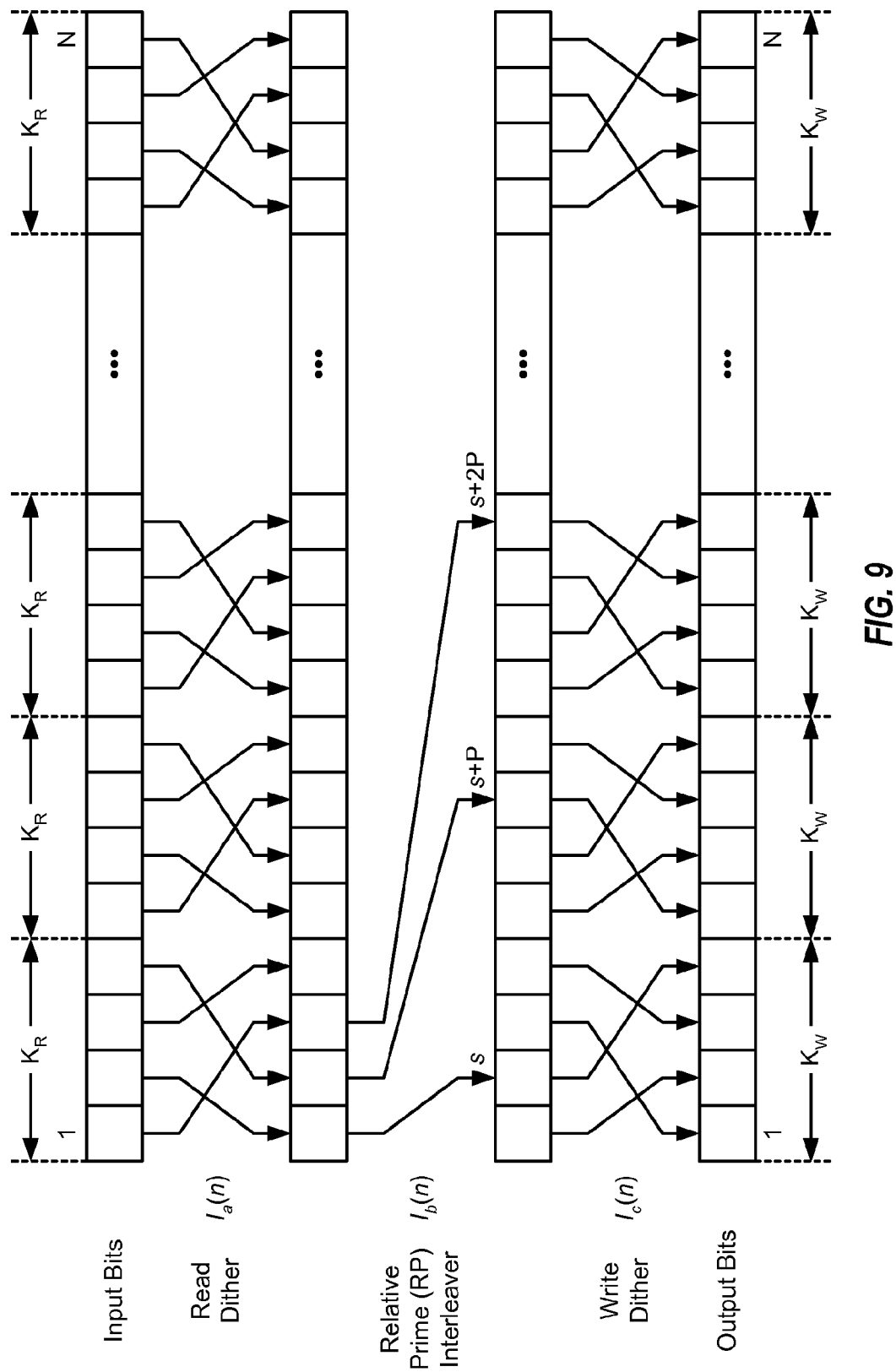
FIG. 9 shows operation of a dithered relative prime (DRP) interleaver.

FIG. 9 shows the operation of the DRP interleaver. A code block of size N is partitioned into multiple sections of size $K_R$, where N is an integer multiple of $K_R$. The $K_R$ bits in each section are interleaved based on a first/read dither function $I_a(n)$. The N bits after the first dithering are then interleaved based on the RP interleaver, which may be given as $I_b(n)=(s+$ P·n) mod N. The N bits after the RP interleaving are partitioned into multiple sections of size $K_W$, where N is an integer multiple of $K_W$. The $K_W$ bits in each section are interleaved based on a second/write dither function $I_c(n)$ to obtain the final interleaved bits. The DRP interleaver is described in detail by S. Crozier and P. Guinand in a paper entitled "High-Performance Low-Memory Interleaver Banks for Turbo-Codes," *Proc. 54th IEEE Vehicular Tech.*, October 2001, pages 2394-2398, which is publicly available.

A DRP interleaver function $\pi_{drp}(n)$ may be defined based on the two dither functions $I_a(n)$ and $I_c(n)$ and the RP interleaver function $I_b(n)$, as follows:

$$\pi_{drp}(n)=I_c(I_b(I_a(n)), \text{ for } n=0, \ldots, N-1 \quad \text{Eq (7)}$$

The DRP interleaver function has the following properties:

$$\pi_{drp}((n+Q) \bmod N)=(\pi_{drp}(n)+Q-P) \bmod N, \text{ and} \quad \text{Eq (8)}$$

$$\pi_{drp}((n+1) \bmod N)=(\pi_{drp}(n)+D(n \bmod Q)) \bmod N \quad \text{Eq (9)}$$

where D(n) is an overall dither function with a period of Q, and Q is the least common multiple of $K_R$ and $K_W$. It can be shown that the DRP interleaver satisfies the contention-free interleaver criterion in equation (1) and (2) with K=Q.

In another design, a contention-free Turbo interleaver may be implemented with an almost regular permutation (ARP) interleaver. The ARP interleaver uses the RP interleaver but adds a small deviation at each location. An ARP interleaver function $\pi_{arp}(n)$ may be defined as follows:

$$\pi_{arp}(n)=(P \cdot n + P \cdot A(n) + B(n)) \bmod N, \text{ for } n=0, \ldots, N-1 \quad \text{Eq (10)}$$

where A(n) and B(n) are functions with a period of C, which is a divider of N.

The values of A(n) and B(n) may be small compared to P and N/K. The term $P \cdot A(n)+B(n)$ adds a perturbation to the RP interleaver. The ARP interleaver is described in detail by C. Berrou et al. in a paper entitled "Designing Good Permutations for Turbo Codes: Towards a Single Model," *IEEE Int. Conf on Comm.*, Vol. 1, 20-24 June 2004, pages 341-345, which is publicly available. With careful selection of A(n) and B(n), the Berrou paper shows that the ARP interleaver can satisfy the contention-free interleaver criterion in equation (1) and (2) with M=C, and possibly with M=p·C, provided that N is a multiple of p.

In yet another design, a contention-free Turbo interleaver may be implemented with a quadratic permutation polynomial (QPP) interleaver. A QPP interleaver function $\pi_{arp}(n)$ may be defined as follows:

$$\pi_{arp}(n)=(a \cdot n + b \cdot n^2) \bmod N, \text{ for } n=0, \ldots, N-1 \quad \text{Eq (11)}$$

where a and b are two constants for a quadratic polynomial. Specific values may be selected for a and b for the QPP interleaver for each large code block size.

It can be shown that if the quadratic polynomial is a permutation polynomial for N, then the QPP interleaver is contention free for any K that divides N. The QPP interleaver is described in detail by Jin Sun and Oscar Y. Takeshita in a paper entitled "Interleavers for Turbo Codes Using Permutation Polynomials Over Integer Rings," IEEE Transaction of Information Theory, Vol. 51, Issue 1, page 101-119, 2005, which is publicly available. It is shown that the QPP interleaver can satisfy the contention-free interleaver criteria of equation (1) and (2) as long as K is a divider of N.

Figure 10:
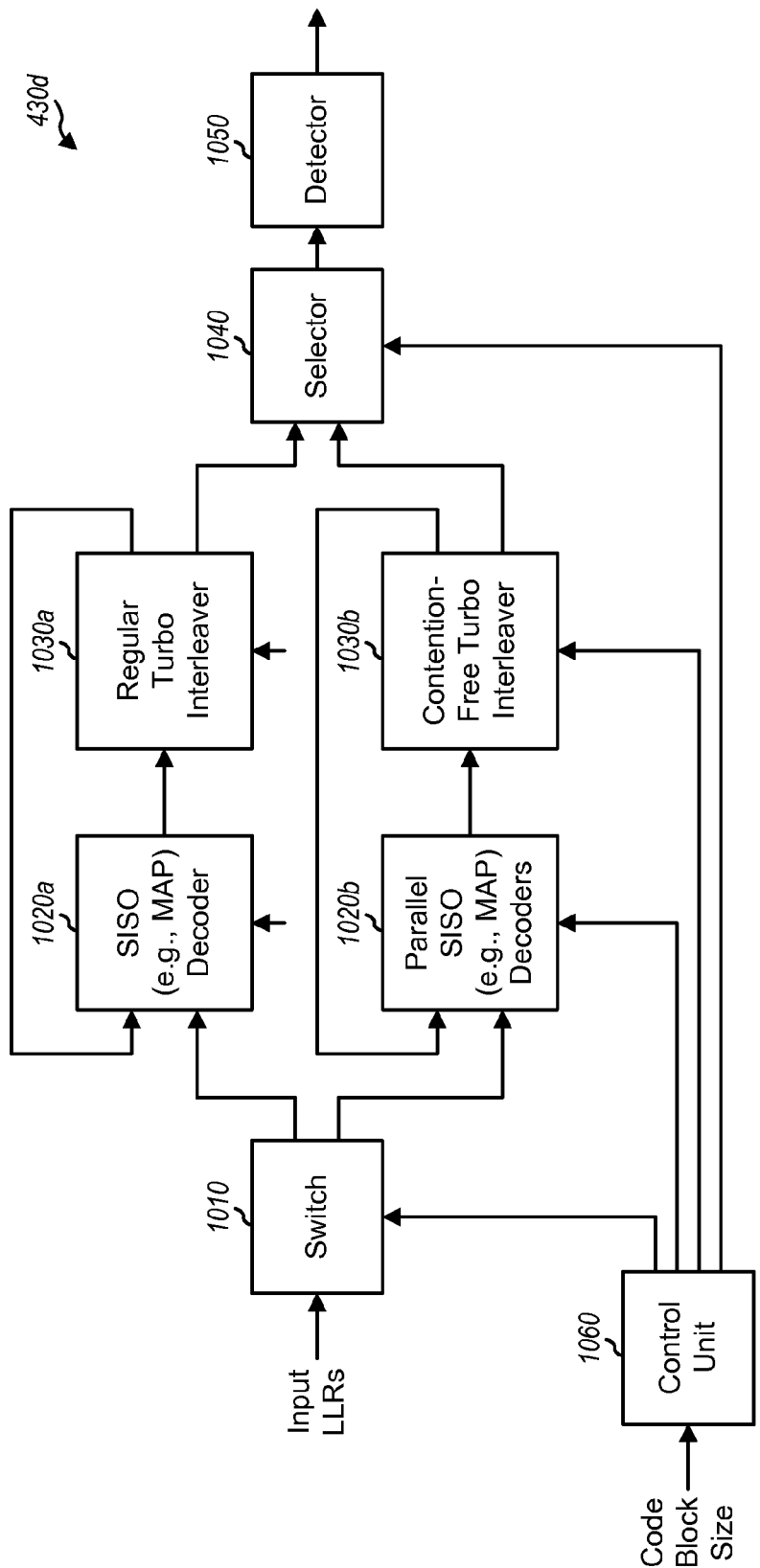
FIG. 10 shows a block diagram of a configurable Turbo decoder.

FIG. 10 shows a block diagram of a design of a Turbo decoder 430*d*, which may also be used for Turbo decoder 430 in FIG. 4. Within Turbo decoder 430*d*, a control unit 1060 may receive a selected code block size and determine whether the code block size is greater than the threshold size. Unit 1060 may select a regular Turbo interleaver 1030*a* if the code block size is not greater than the threshold size and may select a contention-free Turbo interleaver 1030*b* otherwise. Unit 1060 may generate various controls based on the code block size.

A switch 1010 may receive input LLRs for a code block, provide the input LLRs to a SISO decoder 1020*a* if the code block size is not greater than the threshold size, and provide the input LLRs to SISO decoders 1020*b* otherwise. SISO decoder 1020*a* may comprise SISO decoder 620 in FIG. 6. Regular Turbo interleaver 1030*a* may comprise interleaver 630, deinterleaver 640, and storage unit 650 in FIG. 6. SISO decoder 1020*a* and regular Turbo interleaver 1030*a* may operate as described above for FIG. 6. Unit 1060 may provide the selected code block size and/or control signals to SISO decoder 1020*a* and regular Turbo interleaver 1030*a*, which may operate based on the code block size.

SISO decoders 1020*b* may comprise demultiplexer 710 and SISO decoders 720*a* through 720*m* in FIG. 7. Contention-free Turbo interleaver 1030*b* may comprise code interleavers 730*a* through 730*m*, code deinterleavers 740*a* through 740*m*, and storage units 750*a* through 750*m* in FIG. 7. SISO decoders 1020*b* and contention-free Turbo interleaver 1030*b* may operate as described above for FIG. 7. Unit 1060 may provide the code block size to SISO decoders 1020*b*, which may demultiplex and decode the input LLRs based on the segment size K for the code block size. Unit 1060 may also provide the code block size to contention-free Turbo interleaver 1030*b*, which may select the proper contention-free Turbo interleaver function to use for decoding.

After all decoding iterations are completed, a selector 1040 may receive the final data bit LLRs from Turbo interleaver 1030*a* or 1030*b*. Selector 1040 may provide the final data bit LLRs from Turbo interleaver 1030*a* if the code block size is not greater than the threshold size and may provide the final data bit LLRs from Turbo interleaver 1030*b* otherwise. A detector 1050 may receive the final data bit LLRs from selector 1040 and provide decoded bits.

Figures 11, 12:
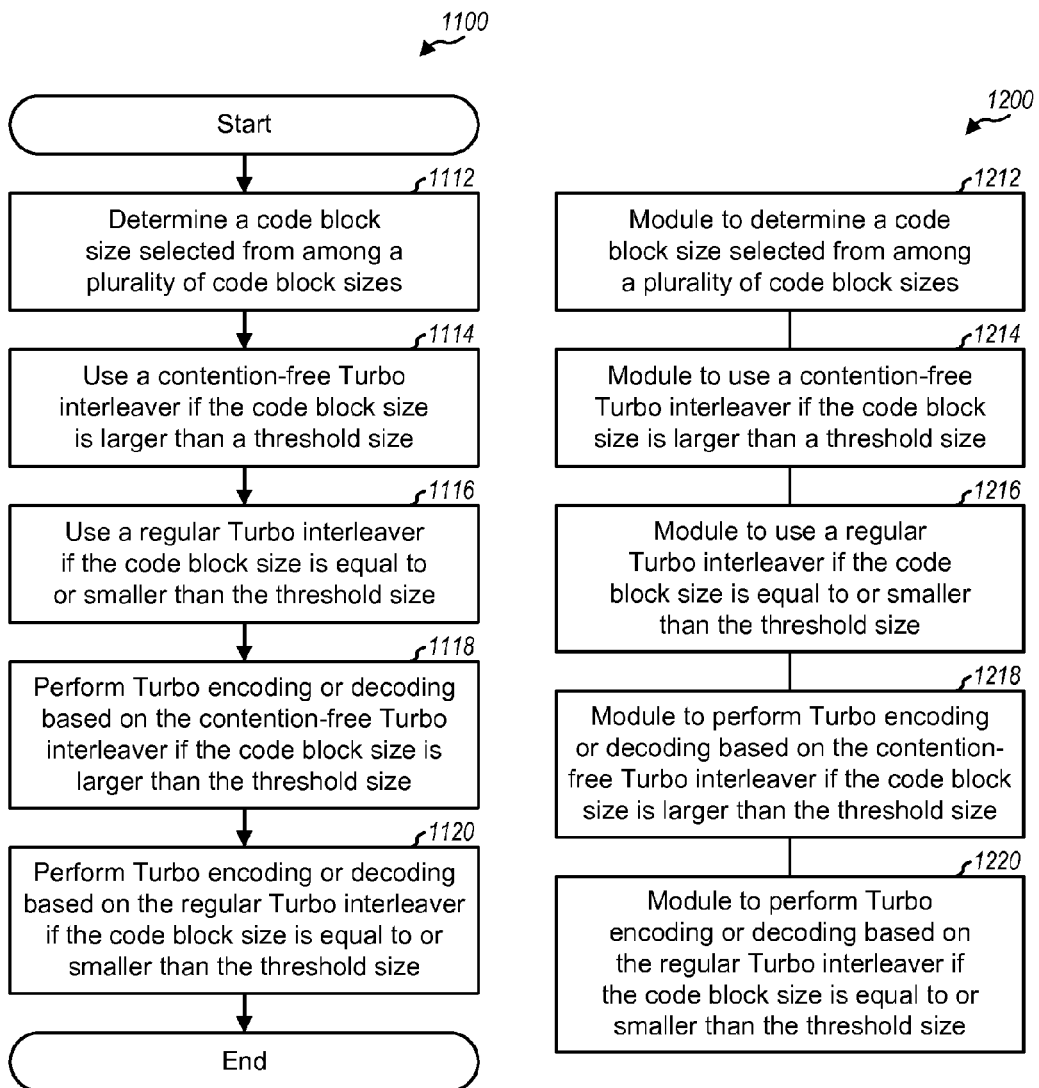
FIG. 11 shows a design of a process for processing data.
FIG. 12 shows a design of an apparatus for processing data.

FIG. 11 shows a design of a process 1100 for processing data. Process 1100 may be performed by a transmitter or a receiver, e.g., by a UE, a base station, or some other entity. A code block size selected from among a plurality of code block sizes may be determined (block 1112). The code block size may be selected based on the size of a data payload being transmitted, e.g., as shown in FIG. 8. A contention-free Turbo interleaver may be used if the code block size is larger than a threshold size (block 1114). A regular Turbo interleaver may be used if the code block size is equal to or smaller than the threshold size (block 1116). The plurality of code block sizes may comprise multiple larger code block sizes that are larger than the threshold size. Each larger code block size may be associated with a respective contention-free Turbo interleaver. The multiple larger code block sizes may linearly increase by a predetermined step size. The plurality of code block sizes may also comprise multiple smaller code block sizes that are equal to or smaller than the threshold size. The regular Turbo interleaver may be used for all of the smaller code block sizes.

Turbo encoding or decoding may be performed based on the contention-free Turbo interleaver if the code block size is larger than the threshold size (block 1118). Turbo encoding or decoding may be performed based on the regular Turbo interleaver if the code block size is equal to or smaller than the threshold size (block 1120).

For a transmitter (e.g., a base station), Turbo encoding may be performed for a code block based on multiple constituent encoders and the contention-free Turbo interleaver if the code block size is larger than the threshold size. Turbo encoding may be performed for the code block based on the multiple constituent encoders and the regular Turbo interleaver if the code block size is equal to or smaller than the threshold size.

For a receiver (e.g., a UE), Turbo decoding may be performed for the code block based on multiple SISO decoders and the contention-free Turbo interleaver if the code block size is larger than the threshold size. Multiple storage units may be used to store information from the multiple SISO decoders. The information from the multiple SISO decoders, after interleaving or deinterleaving based on the contention-free Turbo interleaver, may be written in parallel to the multiple storage units in each write cycle. The contention-free Turbo interleaver may be based on a DRP interleaver, an ARP interleaver, a QPP interleaver, or some other type of interleaver that can support contention free access of the multiple storage units. Turbo decoding may be performed for the code block based on at least one SISO decoder and the regular Turbo interleaver if the code block size is equal to or smaller than the threshold size.

FIG. 12 shows a design of an apparatus 1200 for processing data. Apparatus 1200 includes means for determining a code block size selected from among a plurality of code block sizes (module 1212), means for using a contention-free Turbo interleaver if the code block size is larger than a threshold size (module 1214), means for using a regular Turbo interleaver if the code block size is equal to or smaller than the threshold size (module 1216), means for performing Turbo encoding or decoding based on the contention-free Turbo interleaver if the code block size is larger than the threshold size (module 1218), and means for performing Turbo encoding or decoding based on the regular Turbo interleaver if the code block size is equal to or smaller than the threshold size (module 1220).

The modules in FIG. 12 may comprise processors, electronics devices, hardware devices, electronics components, logical circuits, memories, etc., or any combination thereof.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus for processing data, comprising:
at least one processor configured to determine a code block size selected from among a plurality of code block sizes, to use a contention-free Turbo interleaver if the code block size is larger than a threshold size, and to use a regular Turbo interleaver if the code block size is equal to or smaller than the threshold size; and
a memory coupled to the at least one processor.

2. The apparatus of claim 1, wherein the at least one processor is configured to perform decoding for a code block based on multiple soft-input soft-output (SISO) decoders and the contention-free Turbo interleaver if the code block size is larger than the threshold size.

3. The apparatus of claim 2, wherein the memory is configured to implement multiple storage units to store information from the multiple SISO decoders.

4. The apparatus of claim 3, wherein the at least one processor is configured to write the information from the multiple SISO decoders, after interleaving or deinterleaving based on the contention-free Turbo interleaver, to the multiple storage units in parallel in each write cycle.

5. The apparatus of claim 1, wherein the plurality of code block sizes comprise multiple code block sizes larger than the threshold size, and wherein each of the multiple code block sizes is associated with a respective contention-free Turbo interleaver.

6. The apparatus of claim 5, wherein the multiple code block sizes linearly increase by a predetermined step size.

7. The apparatus of claim 5, wherein the multiple code block sizes are given as $$N_i = N_{th} + L \cdot i,$$

where $N_{th}$ is a minimum size, L is a step size between consecutive code block sizes, and $N_i$ is an i-th code block size among the multiple code block sizes.

8. The apparatus of claim 5, wherein the multiple code block sizes are given as $$N_i = N_{I-1} + L_i,$$

where $L_i$ is an increment for an i-th code block size, and $N_i$ is the i-th code block size among the multiple code block sizes.

9. The apparatus of claim 1, wherein the at least one processor is configured to perform decoding for a code block based on at least one soft-input soft-output (SISO) decoder and the regular Turbo interleaver if the code block size is equal to or smaller than the threshold size.

10. The apparatus of claim 1, wherein the plurality of code block sizes comprise multiple code block sizes equal to or smaller than the threshold size, and wherein the regular Turbo interleaver is used for the multiple code block sizes.

11. The apparatus of claim 1, wherein the at least one processor is configured to select the code block size based on a data payload size.

12. The apparatus of claim 1, wherein the at least one processor is configured to perform encoding for a code block based on multiple constituent encoders and the contention-free Turbo interleaver if the code block size is larger than the threshold size.

13. The apparatus of claim 1, wherein the at least one processor is configured to perform encoding for a code block based on multiple constituent encoders and the regular Turbo interleaver if the code block size is equal to or smaller than the threshold size.

14. The apparatus of claim 1, wherein the contention-free Turbo interleaver is based on one of a dithered relative prime (DRP) interleaver, an almost regular permutation (ARP) interleaver, and a quadratic permutation polynomial (QPP) interleaver.

15. A method of processing data, comprising:
determining a code block size selected from among a plurality of code block sizes;
using a contention-free Turbo interleaver if the code block size is larger than a threshold size; and
using a regular Turbo interleaver if the code block size is equal to or smaller than the threshold size.

16. The method of claim 15, further comprising:
performing decoding for a code block based on multiple soft-input soft-output (SISO) decoders and the contention-free Turbo interleaver if the code block size is larger than the threshold size.

17. The method of claim 16, further comprising:
writing information from the multiple SISO decoders, after interleaving or deinterleaving based on the contention-free Turbo interleaver, to multiple storage units in parallel in each write cycle.

18. The method of claim 15, further comprising:
performing decoding for a code block based on at least one soft-input soft-output (SISO) decoder and the regular Turbo interleaver if the code block size is equal to or smaller than the threshold size.

19. The method of claim 15, further comprising:
performing encoding for a code block based on multiple constituent encoders and the contention-free Turbo interleaver if the code block size is larger than the threshold size.

20. The method of claim 15, further comprising:
performing encoding for a code block based on multiple constituent encoders and the regular Turbo interleaver if the code block size is equal to or smaller than the threshold size.

21. An apparatus for processing data, comprising:
means for determining a code block size selected from among a plurality of code block sizes;
means for using a contention-free Turbo interleaver if the code block size is larger than a threshold size; and
means for using a regular Turbo interleaver if the code block size is equal to or smaller than the threshold size.

22. The apparatus of claim 21, further comprising:
means for performing decoding for a code block based on multiple soft-input soft-output (SISO) decoders and the contention-free Turbo interleaver if the code block size is larger than the threshold size.

23. The apparatus of claim 22, further comprising:
means for writing information from the multiple SISO decoders, after interleaving or deinterleaving based on the contention-free Turbo interleaver, to multiple storage units in parallel in each write cycle.

24. The apparatus of claim 21, further comprising:
means for performing decoding for a code block based on at least one soft-input soft-output (SISO) decoder and the regular Turbo interleaver if the code block size is equal to or smaller than the threshold size.

25. The apparatus of claim 21, further comprising:
means for performing encoding for a code block based on multiple constituent encoders and the contention-free Turbo interleaver if the code block size is larger than the threshold size.

26. The apparatus of claim 21, further comprising:
means for performing encoding for a code block based on multiple constituent encoders and the regular Turbo interleaver if the code block size is equal to or smaller than the threshold size.

27. A non-transitory machine-readable medium comprising instructions which, when executed by a machine, cause the machine to perform operations including:

determining a code block size selected from among a plurality of code block sizes;

using a contention-free Turbo interleaver if the code block size is larger than a threshold size; and using a regular Turbo interleaver if the code block size is equal to or smaller than the threshold size.

28. The non-transitory machine-readable medium of claim 27 which, when executed by the machine, cause the machine to perform operations further including:

performing decoding for a code block based on multiple soft-input soft-output (SISO) decoders and the contention-free Turbo interleaver if the code block size is larger than the threshold size.

29. The non-transitory machine-readable medium of claim 28 which, when executed by the machine, cause the machine to perform operations further including:

writing information from the multiple SISO decoders, after interleaving or deinterleaving based on the contention-free Turbo interleaver, to multiple storage units in parallel in each write cycle.

30. An apparatus for processing data, comprising:

at least one processor configured to determine a code block size selected from among a plurality of code block sizes, to use a contention-free Turbo interleaver if the code block size is larger than a threshold size, and to use a regular Turbo interleaver if the code block size is equal to or smaller than the threshold size; and a memory coupled to the at least one processor.

31. The apparatus of claim 30, wherein the at least one processor is configured to perform decoding for a code block based on multiple soft-input soft-output (SISO) decoders and the contention-free Turbo interleaver if the code block size is larger than the threshold size, and to perform decoding for the code block based on at least one SISO decoder and the regular Turbo interleaver if the code block size is equal to or smaller than the threshold size.

* * * * *